United States Patent
Hong et al.

(10) Patent No.: US 6,995,394 B2
(45) Date of Patent: Feb. 7, 2006

(54) THIN FILM TRANSISTOR PANEL LIQUID CRYSTAL DISPLAY

(75) Inventors: Sung-Kyu Hong, Seongnam (KR);
Young-Chol Yang, Kunpo (KR);
Jong-Lae Kim, Seoul (KR);
Kyoung-Ju Shin, Yongin (KR);
Hee-Seob Kim, Hwaseong (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 102 days.

(21) Appl. No.: 10/733,170

(22) Filed: Dec. 11, 2003

(65) Prior Publication Data

US 2004/0178409 A1   Sep. 16, 2004

(30) Foreign Application Priority Data

Dec. 13, 2002   (KR) .................... 10-2002-0079692

(51) Int. Cl.
*H01L 31/20*   (2006.01)
*G02F 1/136*   (2006.01)

(52) U.S. Cl. ............................ 257/59; 257/79; 349/42; 349/43

(58) Field of Classification Search ................. 257/59, 257/70; 349/42, 43, 129
See application file for complete search history.

(56) References Cited

U.S. PATENT DOCUMENTS 6,407,791 B1 *   6/2002   Suzuki et al. ............... 349/129

* cited by examiner

*Primary Examiner*—David Nelms
*Assistant Examiner*—Long Tran
(74) *Attorney, Agent, or Firm*—F. Chau & Associates, LLC (57) ABSTRACT

A thin film transistor array panel is provided, which includes: a pair of first and second gate lines; a data line intersecting the gate lines in an insulating manner; a storage electrode line supplied with a common voltage; a pixel electrode formed in a pixel area defined by the intersections of the first and the second gate lines and the data line and including a plurality of subareas partitioned by cutouts; a direction control electrode formed in the pixel area and including a portion overlapping at least one of the cutouts; a first thin film transistor connected to the pixel electrode, the first signal line, and the third signal line; a second thin film transistor connected to the pixel electrode, the second signal line, and the third signal line; and a third thin film transistor connected to the direction control electrode, the second signal line, and the fourth signal line.

6 Claims, 7 Drawing Sheets

THIN FILM TRANSISTOR PANEL LIQUID CRYSTAL DISPLAY

BACKGROUND OF THE INVENTION (a) Field of the Invention

The present invention relates to a thin film transistor array panel, and in particular, to a thin film transistor array panel for a liquid crystal display.

(b) Description of the Related Art

A typical liquid crystal display ("LCD") includes an upper panel provided with a common electrode and an array of color filters, a lower panel provided with a plurality of thin film transistors ("TFTs) and a plurality of pixel electrodes, and a liquid crystal layer is interposed therebetween. The pixel electrodes and the common electrode are applied with electric voltages and the voltage difference therebetween causes electric field. The variation of the electric field changes the orientations of liquid crystal molecules in the liquid crystal layer and thus the transmittance of light passing through the liquid crystal layer. As a result, the LCD displays desired images by adjusting the voltage difference between the pixel electrodes and the common electrode.

The LCD has a major disadvantage of its narrow viewing angle, and several techniques for increasing the viewing angle have been developed. Among these techniques, the provision of a plurality of cutouts or a plurality of projections on the pixel electrodes and the common electrode opposite each other along with the vertical alignment of the liquid crystal molecules with respect to the upper and the lower panels is promising.

The cutouts provided both at the pixel electrodes and the common electrode give wide viewing angle by generating fringe field to adjust the tilt directions of the liquid crystal molecules.

The provision of the projections both on the pixel electrode and the common electrode distorts the electric field to adjust the tilt directions of the liquid crystal molecules.

The fringe field for adjusting the tilt directions of the liquid crystal molecules to form a plurality of domains is also obtained by providing the cutouts at the pixel electrodes on the lower panel and the projections on the common electrode on the upper panel.

Among these techniques for widening the viewing angle, the provision of the cutouts has problems that an additional mask for patterning the common electrode is required, an overcoat is required for preventing the effect of the pigments of the color filters on the liquid crystal material, and severe disclination is generated near the edges of the patterned electrode. The provision of the projections also has a problem that the manufacturing method is complicated since it is required an additional process step for forming the projections or a modification of a process step. Moreover, the aperture ratio is reduced due to the projections and the cutouts.

SUMMARY OF THE INVENTION

It is a motivation of the present invention to provide a liquid crystal display capable of being manufactured by a simplified processes and forming stable multi-domains.

It is another motivation of the present invention to optimize arrangements of cutouts and a direction control electrode for obtaining stable multi-domains.

A thin film transistor array panel is provided, which includes: an insulating substrate; a pair of first and second signal lines formed on the insulating substrate; a third signal line formed on the insulating substrate and intersecting the first and the second signal lines in an insulating manner; a fourth signal line formed on the insulating substrate and intersecting the second signal line in an insulating manner; a pixel electrode formed in a pixel area defined by the intersections of the first and the second signal lines and the third signal line and including a plurality of subareas partitioned by cutouts; a direction control electrode formed in the pixel area and including a portion overlapping at least one of the cutouts; a first thin film transistor connected to the pixel electrode, the first signal line, and the third signal line; a second thin film transistor connected to the pixel electrode, the second signal line, and the third signal line; and a third thin film transistor connected to the direction control electrode, the second signal line, and the fourth signal line.

The fourth signal line may include a portion overlapping at least one of the cutouts which does not overlap the direction control electrode.

The thin film transistor array panel may further include a fifth signal line placed between the first and the second signal lines, wherein the fourth signal line is located between the first and the second signal lines and the fourth and the fifth signal lines have inversion symmetry.

The fourth signal line is preferably supplied with a common voltage.

The cutouts may include a transverse cutout bisecting the pixel electrode into upper and lower halves and a plurality of oblique cutouts having inversion symmetry with respect to the transverse cutout.

The direction control electrode may include substantially the same layer as the third signal line.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

The present invention now will be described more fully hereinafter with reference to the accompanying drawings, in which embodiments of the inventions invention are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, liquid crystal displays according to embodiments of this invention will be described in detail with reference to the accompanying drawings.

Figure 1:
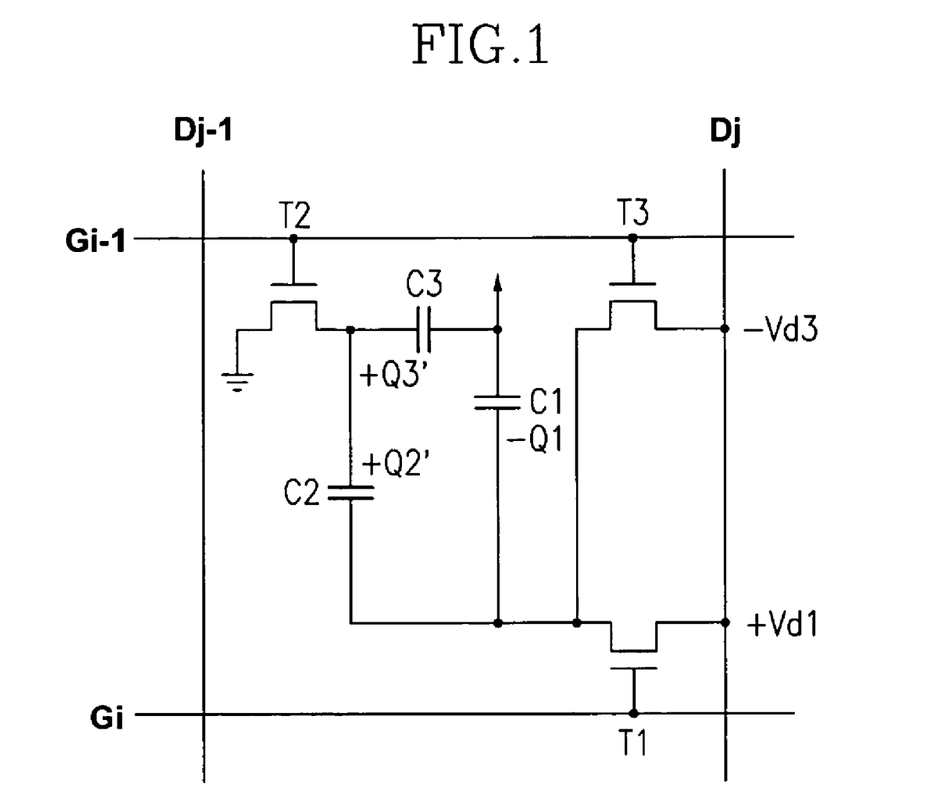
FIG. 1 is an equivalent circuit diagram of an LCD according to an embodiment of the present invention.

FIG. 1 is an equivalent circuit diagram of an LCD according to an embodiment of the present invention.

An LCD according to an embodiment of the present invention includes a plurality of gate lines transmitting gate signals, a plurality of data lines transmitting data voltages, and a plurality of pixels connected to the gate lines and the data lines. As shown in FIG. 1, each pixel includes a plurality of capacitors C1, C2 and C3 and a plurality of TFTs T1, T2 and T3. The transistor T1 has a gate connected to a gate line Gi, a source connected to a data line Dj, and a drain connected to the capacitors C1 and C2, while the transistor T3 has a gate connected to a previous gate line Gi-1, a source connected to a data line Dj, and a drain connected to the capacitors C1 and C2. The transistor T2 has a gate connected to the previous gate line Gi-1, a source connected to a predetermined voltage such as a common voltage Vcom, and a drain connected to the capacitors C2 and C3. The capacitors C2 and C3 are connected in parallel to a predetermined voltage such as the common voltage Vcom.

In structural view, the LCD includes a TFT array panel (not shown), a color filter array panel (not shown) facing the TFT array panel and separated with a predetermined gap, and a liquid crystal layer (not shown) filled in the predetermined gap.

The TFT array panel includes a plurality of gate lines and a plurality of data lines intersecting each other to define a plurality of pixel areas as well as a plurality of storage electrode lines transmitting a predetermined voltage such as the common voltage Vcom.

Each pixel area is provided with a pixel electrode (PE) (not shown), a direction control electrode (DCE) (not shown), first and second PE TFTs (indicated by the reference numerals T1 and T3 in FIG. 1) for the PE, and a DCE TFT (indicated by the reference T2 in FIG. 1) for the DCE. The first PE TFT T1 includes a gate electrode connected to a gate line Gi, a source electrode connected to a data line Dj, and a drain electrode connected to the PE, while the second PE TFT T2 includes a gate electrode connected to a previous gate line Gi-1, a source electrode connected to the data line Dj, and a drain electrode connected to the PE. The DCE TFT T2 includes a gate electrode connected to the previous gate line Gi-1, a source electrode connected to a storage electrode line, and a drain electrode connected to the DCE.

The color filter array panel includes a plurality of color filters (not shown) and a common electrode (not shown) provided with the common voltage Vcom.

The PE and the common electrode along with the liquid crystal layer interposed therebetween form a liquid crystal (LC) capacitor indicated by $C_{LC}$. The PE and the storage electrode line along with an insulator disposed therebetween form a storage capacitor represented by $C_{ST}$. Since both the common electrode and the storage electrode lines are supplied with the common voltage Vcom, the LC capacitor $C_{LC}$ and the storage capacitor $C_{ST}$ can be represented by a single storage capacitor C1 as shown in FIG. 1.

The DCE and the PE are capacitively coupled to form a capacitor represented by C2.

The DCE and the common electrode are also capacitively coupled to form a capacitor represented by C3. The capacitor C3 may further indicate a parasitic capacitor generated between the DCE and the storage electrode lines.

The reference numerals for the above-described capacitors are also used for indicating the capacitances of the capacitors in this specification.

The PE may have an aperture overlapping the DCE such that an electric field generated by the DCE goes out through the aperture. The electric field generated by the DCE pre-tilts liquid crystal molecules in the liquid crystal layer. The pretilted liquid crystal molecules are rapidly tilted without dispersion upon the application of the electric field generated by the PE.

In order to obtain the pretilt of the liquid crystal molecules using the electric field generated by the DCE, a voltage of the DCE relative to a voltage of the common electrode (referred to as a "DCE voltage" hereinafter) is larger than a voltage of the PE relative to a voltage of the common electrode (referred to as a "pixel voltage" hereinafter) by a predetermined value.

The LCD according to an embodiment of the present invention easily satisfies this requirement by applying the voltage for the storage electrode line to the DCE and applying a previous data voltage for a previous pixel row to the PE and then, electrically isolating the DCE before a main data voltage is applied to the PE.

Consider a moment that a given PE in an LCD in dot inversion is refreshed by a positive potential. A gate-on voltage applied to the previous gate line Gi-1 turns on the DCE TFT T2 to apply the common voltage Vcom to the DCE and it also turns on the second PE TFT T3 to apply a previous data voltage with a negative polarity (with reference to the common voltage Vcom) to the PE. Accordingly, the DCE voltage $V_{DCE}$ is higher than the pixel voltage $V_p$.

When the DCE TFT T2 is turned off to floats the DCE, the capacitor C2 formed by the DCE and the PE maintains the voltage difference therebetween such that the DCE voltage $V_{DCE}$ is always higher than the pixel voltage $V_p$ irrespective of the change of the pixel voltage $V_p$. For example, the pixel voltage $V_p$ is increased to a positive value when the first PE TFT T1 is turned on, and the DCE voltage $V_{DCE}$ follows the voltage increase of the PE in order to maintain the voltage difference between the DCE and the PE.

A voltage Vc across a capacitor having a capacitance C is given by:

$$V_C = V_0 + \frac{1}{C}\int_0^t i(t)dt, \qquad (1)$$

where $V_0$ is an initial voltage across the capacitor and i(t) is a current flowing in the capacitor as function of time t.

A floating electrode is equivalent to an electrode connected to a resistor having an infinite resistance. Therefore, i=0 and Vc=$V_0$, that is, the initial voltage across the capacitor is maintained. In other words, the voltage of the floating electrode increased or decreased coupled with the voltage of the other electrode.

On the contrary, when the PE is refreshed with a negative polarity data voltage, the DCE voltage $V_{DCE}$ is always lower than the pixel voltage $V_p$ by a predetermined value since the previous data voltage has a positive polarity.

The DCE Voltage $V_{DCE}$ is given from FIG. 1:

$$V_{DCE} \approx \frac{C2}{C2+C3}(Vd1+Vd3), \qquad (2)$$

where Vd1 is a data voltage for the PE subtracted by the common voltage Vcom and (−Vd3) is the data voltage for a previous PE subtracted by the common voltage Vcom.

Relation 2 is derived by the following procedures.

When the gate-on voltage is applied to the previous gate line Gi-1, the second PE TFT T2 and the DCE TFT T3 turn on, while the first PE TFT T1 maintains its inactivation state. Then, the common voltage Vcom is applied to the DCE so that the DCE voltage $V_{DCE}$ becomes zero, and the previous data voltage is applied to the PE such that the pixel voltage $V_p$ of the PE is equal to (−Vd3). Accordingly, the electric charges Q1, Q2 and Q3 stored in the capacitors C1, C2 and C3 are given:

$$Q3 = C3 \cdot V_{DCE} = 0; \tag{3}$$

$$Q2 = C2 \cdot (V_{DCE} + Vd3) = C2 \cdot Vd3; \text{ and} \tag{4}$$

$$Q1 = C1 \cdot Vd3. \tag{5}$$

When the gate-on voltage is applied to the relevant gate line Gi, the first PE TFT T1 turns on, while the TFTs T2 and T3 turn off. Accordingly, the DCE becomes floating so that the electrical charges stored in the DCE is kept constant. The charge conservation law results in:

$$Q'2 + Q'3 = Q2 + Q3 = C2 \cdot Vd3, \tag{6}$$

where Q'2 and Q'3 are charged in the capacitors C2 and C3 after the DCE is floated.

Furthermore, the voltage distribution law yields:

$$-Q'2/C2 + Q'3/C3 = Vd1. \tag{7}$$

The substitution of Q'3 in Relation 7 with (C2·Vd3−Q'2), which is obtained from Relation 6, results in:

$$Q'2/C2 = \frac{-C3 \cdot Vd1 + C2 \cdot Vd3}{C2 + C3} = V'2, \tag{8}$$

where V'2 is a voltage across the capacitor C2.

From the voltage distribution law, $$V'2 = V_{DCE} - Vd1. \tag{9}$$

From Relations 8 and 9, Relation 2 is obtained. In the meantime, since the DCE TFT T2 is disconnected from the data line Dj, the DCE may not increase in the load to the data line.

Furthermore, since the DCE is supplied with the common voltage Vcom, the initial field generated by the DCE is stable to prevent the textures in displaying white color as well as red, green and blue colors.

Now, an LCD according to an embodiment of the present invention is described in detail with reference to FIGS. 2 to 5.

Figure 2:
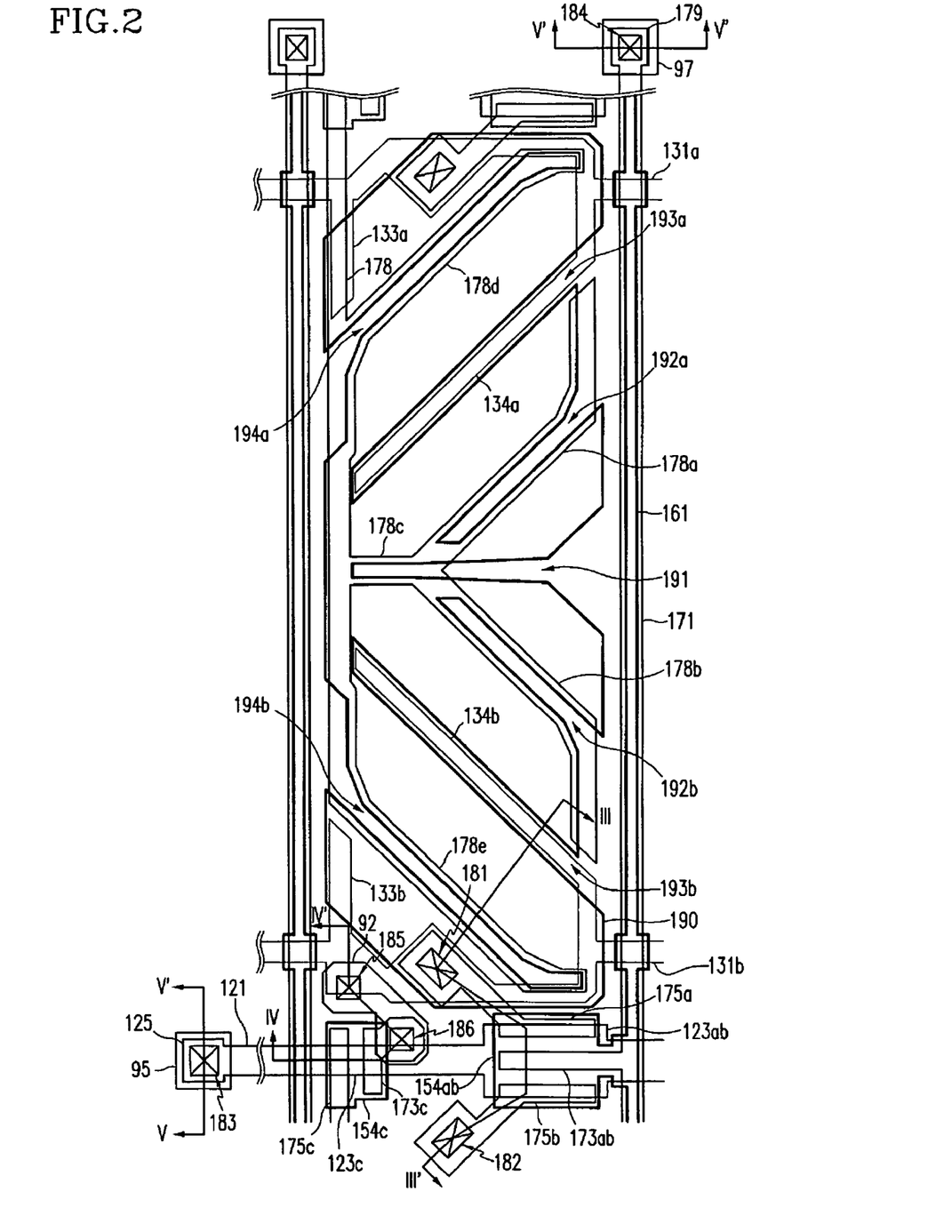
FIG. 2 is a layout view of an LCD according to a first embodiment of the present invention.
Figure 3:
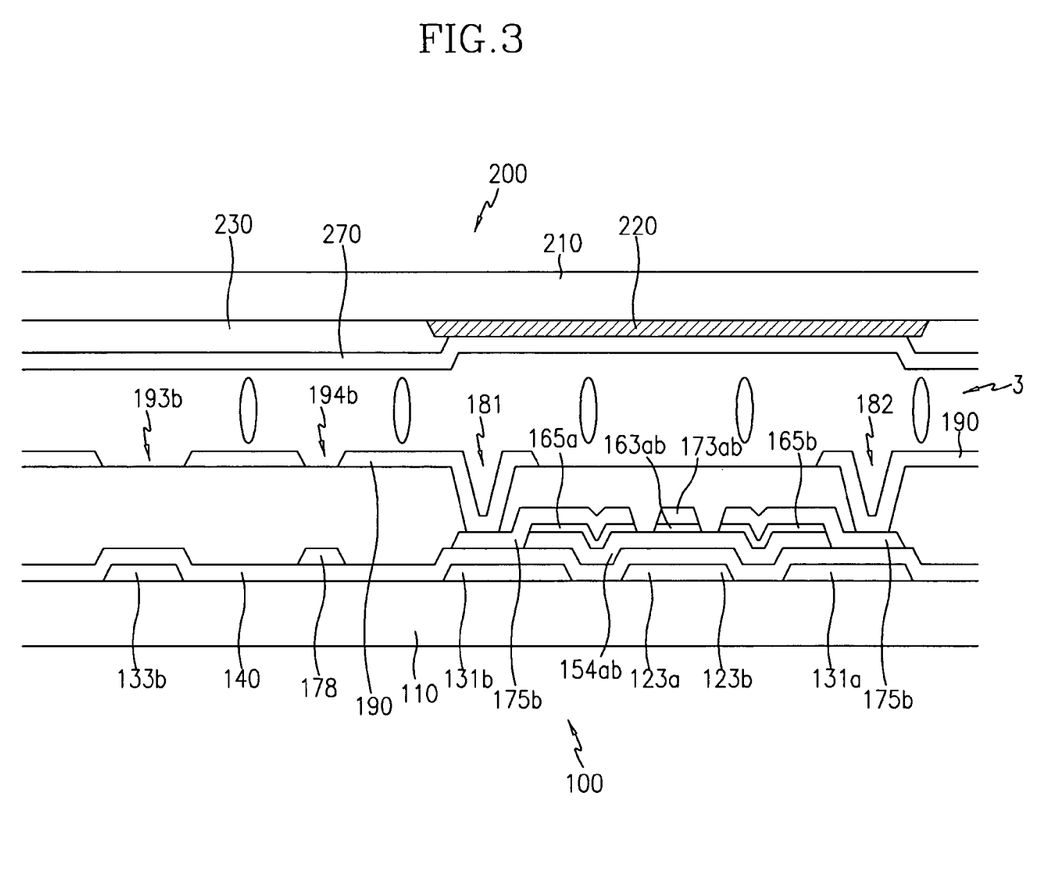
FIG. 3 is a sectional view of the LCD shown in FIG. 2 taken along the line III–III'.
Figure 4:
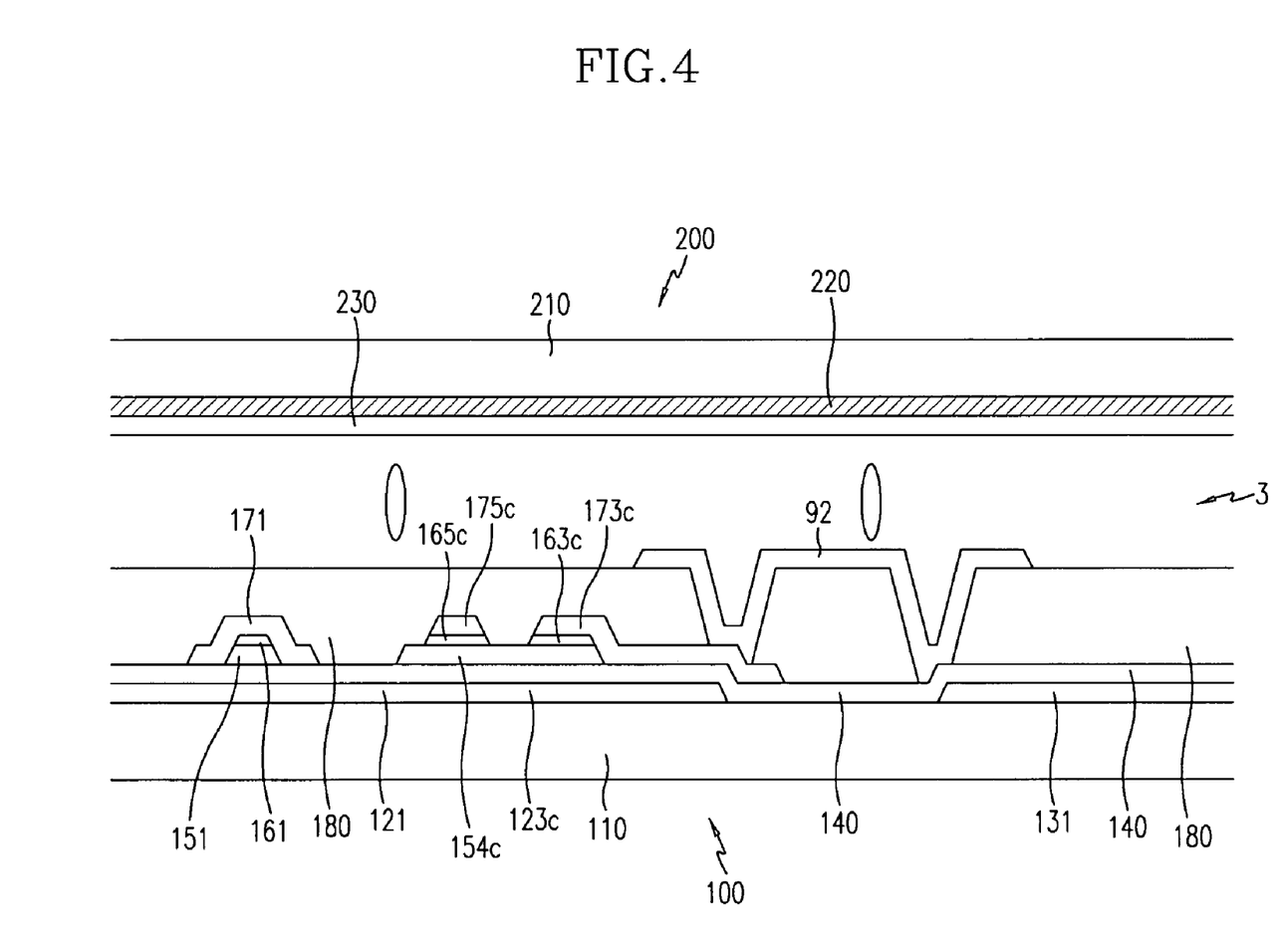
FIG. 4 is a sectional view of the LCD shown in FIG. 2 taken along the line IV–IV'.
Figure 5:
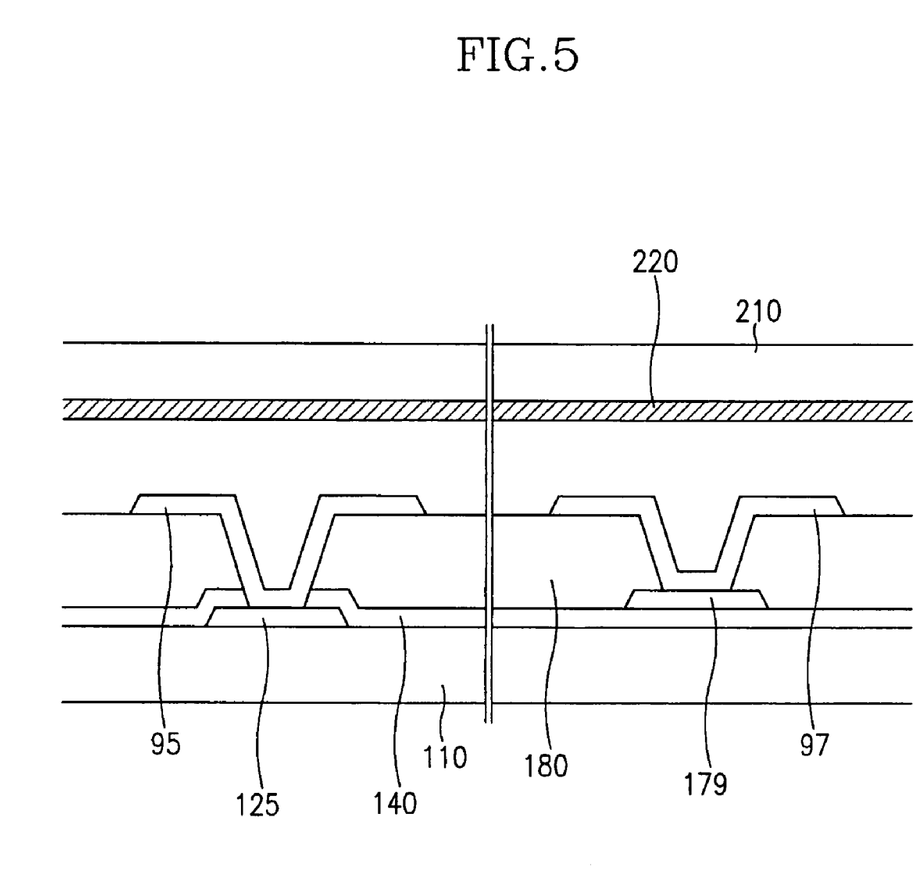
FIG. 5 is a sectional view of the TFT array panel shown in FIG. 2 taken along the lines V–V' and V'–V"

FIG. 2 is a layout view of an LCD according to an embodiment of the present invention, and FIGS. 3, 4 and 5 are sectional views of the LCD shown in FIG. 2 taken along the lines III–III', IV–VI' and V–V'–V".

An LCD according to an embodiment of the present invention includes a TFT array panel 100, a color filter array panel 200 facing the TFT array panel 100, and a vertically (or homeotropically) aligned liquid crystal layer 3 interposed between the TFT array panel 100 and the color filter array panel 200.

The TFT array panel 100 is now described in detail.

A plurality of gate lines 121 are formed on an insulating substrate 110 and a plurality of data lines 171 are formed thereon. The gate lines 121 and the data lines 171 are insulated from each other and intersect each other to define a plurality of pixel areas.

Each pixel area is provided with a PE 190, a DCE 178, first and second PE TFTs, and a DCE TFT.

The first PE TFT has three terminals, a first gate electrode 123ab, a first source electrode 173ab and a first drain electrode 175a, while the second PE TFT has three terminals, the first gate electrode 123ab, the first source electrode 173ab and a second drain electrode 175b. The DCE TFT has three terminals, a second gate electrode 123c, a second source electrode 173c, and a third drain electrode 175c.

The first PE TFT is provided for switching main data voltages transmitted to the pixel electrode 190, while the second PE TFT and the DCE TFT is provided for providing initial voltage differences between the pixel electrode 190 and the DCE 178.

The gate electrode 123ab, the source electrode 173ab, and the drain electrode 175 of the first PE TFT are connected to corresponding one of the gate lines 121, one of the data lines 171, and the pixel electrode 190, respectively. The gate electrode 123ab, the source electrode 173ab, and the drain electrode 175b of the second PE TFT are connected to a previous one of the gate lines 121, the data line 171, and the pixel electrode 190. The gate electrode 123c, the source electrode 173c, and the drain electrode 175c of the DCE TFT are connected to the previous gate line 121, corresponding one of the storage electrode lines 131, and the DCE 178, respectively. The DCE 178 is applied with a direction-controlling voltage for controlling the pre-tilts of the liquid crystal molecules to generate a direction-controlling electric field between the DCE 178 and the common electrode 270. The DCE 178 is formed in a step for forming the data lines 171.

The layered structure of the TFT array panel will be described in detail.

A plurality of gate lines 121 and a plurality of pairs of first and second storage electrode lines 131a and 131b are formed on an insulating substrate 110.

Each gate line 121 extends substantially in a transverse direction and it includes a plurality of pairs of branches forming first and second gate electrodes 123ab and 123c and an expanded end portion 125 for signal reception from an external device.

Each storage electrode line 131a or 131b extends substantially in the transverse direction although it has some curves. Each pair of storage electrode lines 131a and 131b include a plurality of sets of branches forming first fourth storage electrodes 133a, 133b, 134a and 134a. The first and the second storage electrodes 133a and 133b are branched from the first and the second storage electrode lines 131a and 13b in a longitudinal direction, respectively. The third and the fourth storage electrodes 134a and 134b are branched from the first and the second storage electrode lines 131a and 131b in the longitudinal direction and they are curved to extend in oblique directions. The first storage electrode lines 131a and the second storage electrode lines 131b have inversion symmetry.

The gate lines 121 and the storage electrode lines 131a and 131b are preferably made of Al, Cr or their alloys, Mo or Mo alloy. If necessary, the gate lines 121 and the storage electrode lines 131a and 131b include a first layer preferably made of Cr or Mo alloys having excellent physical and chemical characteristics and a second layer preferably made of Al or Ag alloys having low resistivity.

A gate-insulating layer 140 is formed on the gate lines 121 and the storage electrode lines 131a and 131b.

A semiconductor layer 151, 154ab and 154c preferably made of amorphous silicon is formed on the gate insulating layer 140. The semiconductor layer 151, 154ab and 154c includes a plurality of first and second channel semiconductors 154ab and 154c forming channels of TFTs and a plurality of data-line semiconductors 151 located under the data lines 171.

An ohmic contact layer 161, 163ab, 163c, 165a, 165b and 165c preferably made of silicide or n+ hydrogenated amorphous silicon heavily doped with n type impurity is formed on the semiconductor layer 151, 154ab and 154c.

A plurality of data lines 171 including a plurality of first source electrodes 173ab, a plurality of second source electrodes 173c, a plurality of first, second and third drain electrodes 175a, 175b and 175c, and a plurality of DCEs 178 and 178a–178e are formed on the ohmic contact layer 161, 163ab, 163c, 165a, 165b and 165c and the gate insulating layer 140.

The data lines 171 extend in the longitudinal direction and intersect the gate lines 121 to define a plurality of pixels. The first source electrodes 173ab are branched from the data lines 171 and extend onto portions 163ab of the ohmic contact layer. The first and the second drain electrodes 175a and 175b are disposed on portions 165a and 165b of the ohmic contact layer, located opposite each other with respect to the first source electrodes 173ab, and separated from the first source electrodes 173ab. The second source electrodes 173c and the third drain electrodes 175c are disposed on respective portions 163c and 165c opposite each other. Each data line 171 includes an expanded end portion 179 for receiving data voltages from an external device.

The DCEs 178 and 178a–178e are located in the pixel areas defined by the intersections of the gate lines 121 and the data lines 171. Each DCE 178 and 178a–178e includes a stem 178, a pair of oblique branches 178d and 178e obliquely extending from the stem 178, a transverse branch 178c extending in the transverse direction from the stem 178, and a pair of curved branches 178a and 178b obliquely branched from the transverse branch 178c and extending in the longitudinal direction.

The data lines 171, the source electrodes 173ab and 173c, the drain electrodes 175a–175c, and the DCEs 178 and 178a–178e are preferably made of Al, Cr or their alloys, Mo or Mo alloy. If necessary, the data lines 171, the source electrodes 173ab and 173c, the drain electrodes 175a–175c, and the DCEs 178 and 178a–178e include a first layer preferably made of Cr or Mo alloys having excellent physical and chemical characteristics and a second layer preferably made of Al or Ag alloys having low resistivity.

A passivation layer 180 preferably made of silicon nitride or organic insulator is formed on the data lines 171, the source electrodes 173ab and 173c, the drain electrodes 175a–175c, and the DCEs 178 and 178a–178e.

The passivation layer 180 and the gate insulating layer 140 are provided with a plurality of contact holes 181 and 182 exposing the first and the second drain electrodes 175a and 175b, a plurality of contact holes 183 exposing the end portions 125 of the gate lines 121, a plurality of contact holes 184 exposing the end portions 179 of the data lines 171, a plurality of contact holes 185 exposing the storage electrode lines 131, and a plurality of contact holes 185 exposing the second source electrodes 173c.

A plurality of PEs 190, a plurality of contact assistants 95 and 97, and a plurality of connections 92 are formed on the passivation layer 180.

Each PE 190 is connected to the first and the second drain electrode 175a, 175b and 175c through the contact holes 181 and 182, respectively. The PE 190 has a transverse cutout 191 and a plurality of oblique cutouts 192a, 192b, 193a, 193b, 194a and 194b. The transverse cutout 191 bisects the PE 190 into upper and lower halves, and the oblique cutouts 192a, 192b, 193a, 193b, 194a and 194b have inversion symmetry with respect to the transverse cutout 191. Some cutouts 191, 192a, 192b, 194a and 194b overlap the DCE 178 and 178a–178e while the other cutouts 193a and 193b overlap the storage electrodes 133a and 133b.

The connections 92 are connected to the storage electrode lines 131 through the contact holes 185 and to the second source electrodes 173c through the contact holes 186.

The contact assistants 95 and 97 are connected to the exposed end portions 125 of the gate lines 121 and the exposed end portions 179 of the data lines 171 through the contact holes 183 and 184, respectively.

The PEs 190, the connections 92, and the contact assistants 95 and 97 are are preferably formed of IZO or ITO.

To summarize, each PE 190 has the plurality of cutouts 191, 192a, 192b, 193a, 193b, 194a and 194b, and some cutouts 191, 192a, 192b, 194a and 194b overlap the DCE 178 and 178a–178e. The DCE 178 and 178a–178e and the cutouts 191, 192a, 192b, 194a and 194b are aligned such that the DCE 178 and 178a–178e is exposed through the cutouts 191, 192a, 192b, 194a and 194b to be seen in front view.

The cutouts 191, 192a, 192b, 193a, 193b, 194a and 194b partition the PE 190 into a plurality of subareas, and liquid crystal regions located on the subareas are called domains. The domains disposed opposite each other with respect to a cutout have different tilt directions and they are classified into four groups based on the tilt directions.

The DCE 178 and 178a–178e is connected to the DCE TFT, while the PE 190 is connected to the first and the second PE TFT.

According to another embodiment of the present invention, the DCEs 178 and 178a–178e include substantially the same layer as the gate lines 121. Portions of the passivation layer 180 located on the DCEs 178 and 178a–178e may be removed to form a plurality of openings.

The upper panel 200 will no be described in detail.

A black matrix 220 for preventing light leakage, a plurality of red, green and blue color filters 230, and a common electrode 270 preferably made of a transparent conductor such as ITO or IZO are formed on an upper substrate 210 preferably made of transparent insulating material such glass.

A plurality of liquid crystal molecules contained in the liquid crystal layer 3 is aligned such that their director is perpendicular to the lower and the upper substrates 110 and 210 in absence of electric field. The liquid crystal layer 3 has negative dielectric anisotropy.

The TFT array panel 110 and the color filter panel 200 are aligned such that the PEs 190 match and overlap the color filters 230. In this way, a pixel region is divided into a plurality of domains by the cutouts 191, 192a, 192b, 193a, 193b, 194a and 194b. The alignment of the liquid crystal layer 3 in each domain is stabilized by the DCE 178 and 178a–178e.

This embodiment illustrates the liquid crystal layer 3 having negative dielectric anisotropy and homeotropic alignment with respect to the substrates 110 and 210. However, the liquid crystal layer 3 may have positive dielectric anisotropy and homogeneous alignment with respect to the substrates 110 and 210.

A TFT array panel according to another embodiment of the present invention may be manufactured using four photo-etching steps. In this case, a semiconductor layer may have substantially the same planar shape as data lines, source electrode, drain electrodes, DCEs, and underlying ohmic contacts, which is resulted from the patterning using a single photoresist.

In the above-structured liquid crystal display, the domain partitioning is made by way of the apertures of the PE, and the domain stability is reinforced by way of the direction control electrode and the storage electrode. Therefore, the domain partitioning depends upon the arrangement of the PE apertures, the direction control electrode and the storage electrode, and the domain stability is also largely influenced by the arrangement.

An exemplary TFT array panel for an LCD according to another embodiment of the present invention is described in detail with reference to FIG. 6.

Figure 6:
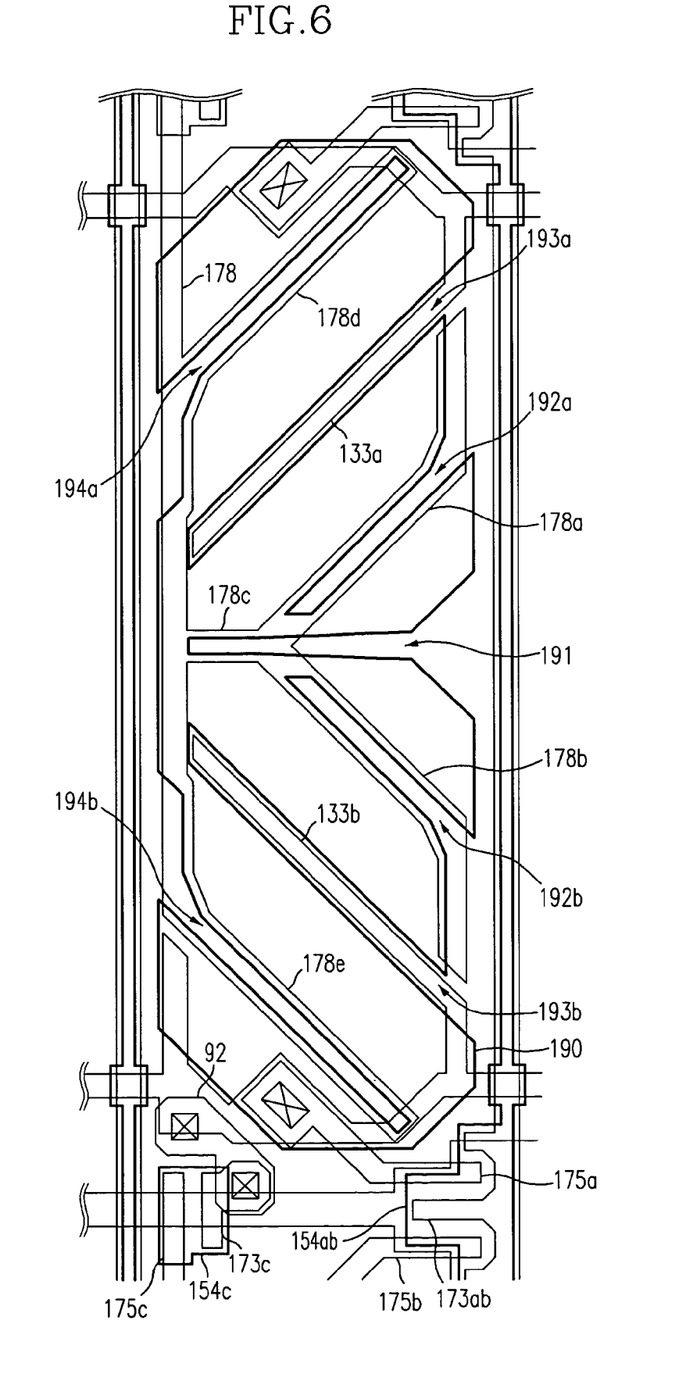
FIGS. 6 and 7 are layout views of LCDs according to other embodiments of the present invention.

FIG. 6 is a layout view of an LCD according to another embodiment of the present invention.

As shown in FIG. 6, a source electrode 173ab has a W shape partly enclosing drain electrodes 175a and 175b so that the width of channels of TFTs is increased.

Other structures of the TFT panel shown in FIG. 6 are similar to those shown in FIG. 2.

An exemplary TFT array panel for an LCD according to another embodiment of the present invention is described in detail with reference to FIG. 7.

Figure 7:
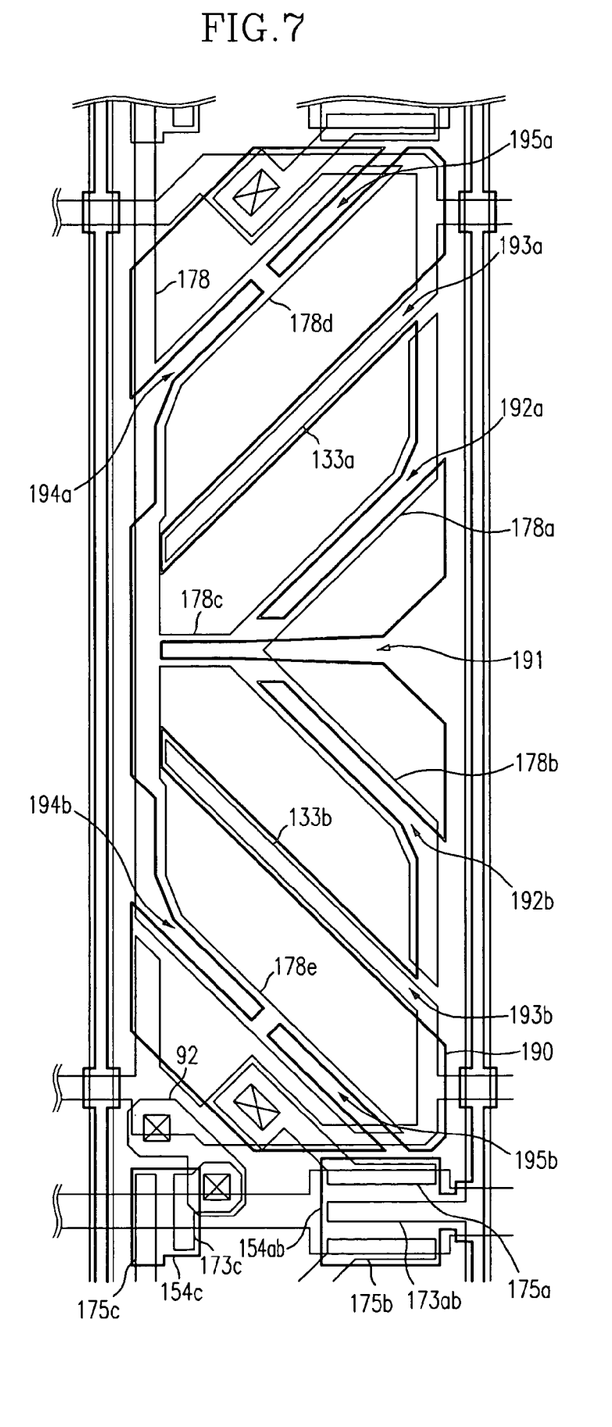

FIG. 7 is a layout view of an LCD according to another embodiment of the present invention.

As shown in FIG. 7, a pair of oblique cutouts 194a and 194b of a PE 190 end far from an upper edge of the PE 190, and a pair of other oblique cutouts 195a and 195b opposite the cutouts 194a and 194b are additionally provided at the PE 190 such that a bridge connecting partitions of the PE 190 located opposite each other with respect to the cutouts 194a, 194b, 195a and 195b.

Other structures of the TFT panel shown in FIG. 6 are similar to those shown in FIG. 2.

As described above, the application of the common voltage to the DCE via the storage electrodes stabilizes the textures in a three color LCD as well as a four color LCD including white pixels.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   an insulating substrate;
   a pair of first and second signal lines formed on the insulating substrate;
   a third signal line formed on the insulating substrate and intersecting the first and the second signal lines in an insulating manner;
   a fourth signal line formed on the insulating substrate and intersecting the third signal line in an insulating manner;
   a pixel electrode formed in a pixel area defined by the intersections of the first and the second signal lines and the third signal line and including a plurality of subareas partitioned by cutouts;
   a direction control electrode formed in the pixel area and including a portion overlapping at least one of the cutouts;
   a first thin film transistor connected to the pixel electrode, the first signal line, and the third signal line;
   a second thin film transistor connected to the pixel electrode, the second signal line, and the third signal line; and
   a third thin film transistor connected to the direction control electrode, the second signal line, and the fourth signal line.

2. The thin film transistor array panel of claim 1, wherein the fourth signal line includes a portion overlapping at least one of the cutouts which does not overlap the direction control electrode.

3. The thin film transistor array panel of claim 2, further comprising a fifth signal line placed between the first and the second signal lines, wherein the fourth signal line is located between the first and the second signal lines and the fourth and the fifth signal lines have inversion symmetry.

4. The thin film transistor array panel of claim 1, wherein the fourth signal line is supplied with a common voltage.

5. The thin film transistor array panel of claim 1, wherein the cutouts comprise a transverse cutout bisecting the pixel electrode into upper and lower halves and a plurality of oblique cutouts having inversion symmetry with respect to the transverse cutout.

6. The thin film transistor array panel of claim 2, wherein the direction control electrode comprises substantially the same layer as the third signal line.

* * * * *